United States Patent [19]

Takano et al.

[11] Patent Number: 5,445,698
[45] Date of Patent: Aug. 29, 1995

[54] METHOD OF FABRICATING AN INTERNAL COMPOSITE LAYER COMPOSED OF AN ELECTRICALLY INSULATING SUBSTRATE WITH A COPPER LAYER FORMED THEREON AND A FILM OF A COUPLING AGENT COVERING THE COPPER LAYER FOR A MULTILAYER CIRCUIT BOARD

[75] Inventors: Hidekazu Takano; Tokio Yoshimitsu; Akinori Hibino, all of Kouriyama; Yoshihide Sawa, Yamatotakada; Motoyuki Toki, Kyoto; Yang Wu, Kyoto; Yuen C. Tak, Kyoto; Tadao Ohnaka, Kyoto, all of Japan

[73] Assignee: Matsushita Electric Works, Ltd., Osaka, Japan

[21] Appl. No.: 22,027

[22] Filed: Feb. 24, 1993

[30] Foreign Application Priority Data

Feb. 25, 1992 [JP] Japan .................................. 4-036867

[51] Int. Cl.⁶ ............................................. B32B 31/12
[52] U.S. Cl. ................................ 156/307.7; 156/329; 156/60
[58] Field of Search ...................... 156/60, 307.7, 329; 427/96; 148/269, 272, 276

[56] References Cited

U.S. PATENT DOCUMENTS

| | | | |
|---|---|---|---|
| 4,642,161 | 2/1987 | Akahoshi et al. | |
| 5,061,550 | 10/1991 | Shimizu et al. | 428/209 |
| 5,190,808 | 3/1993 | Tenney et al. | 428/224 |
| 5,261,154 | 11/1993 | Ferrier et al. | 29/830 |

FOREIGN PATENT DOCUMENTS

| | | |
|---|---|---|
| 2308592 | 12/1990 | Japan . |
| 2308593 | 12/1990 | Japan . |
| 2308595 | 12/1990 | Japan . |
| 2308596 | 12/1990 | Japan . |

*Primary Examiner*—Michael W. Ball
*Assistant Examiner*—Richard Crispino
*Attorney, Agent, or Firm*—Armstrong, Westerman, Hattori, McLeland & Naughton

[57] ABSTRACT

An internal composite layer for a multilayer circuit board, which is composed of an electrically insulating substrate with a copper layer formed thereon and a film of a coupling agent covering the copper layer is fabricated in accordance with the following method. That is, the copper layer is treated with a base or the base and an accelerating agent to supply hydroxyl groups to a surface thereof. Subsequently, thus treated copper layer is coated with the coupling agent, e.g., a silane coupling agent. The coupling agent is chemically bonded to the treated copper layer by the reaction of the hydroxyl groups with the coupling agent, so that an adhesion strength between the copper layer and the coupling agent is remarkably increased. In addition, since it is not necessary for forming a copper oxide layer in the surface of the copper layer, the internal composite layer shows excellent acid resistance without causing a pink-ring which usually occur around a through-hole plating.

14 Claims, No Drawings

METHOD OF FABRICATING AN INTERNAL COMPOSITE LAYER COMPOSED OF AN ELECTRICALLY INSULATING SUBSTRATE WITH A COPPER LAYER FORMED THEREON AND A FILM OF A COUPLING AGENT COVERING THE COPPER LAYER FOR A MULTILAYER CIRCUIT BOARD

BACKGROUND OF THE INVENTION

1. Field of the Invention

The present invention relates to a method of fabricating an internal composite layer composed of an electrically insulating substrate with a copper layer formed thereon and a film of a coupling agent covering the copper layer for a multilayer circuit board, which is capable of providing an increased adhesion between the coupling agent and the copper layer and excellent acid resistance of the internal composite layer.

2. Description of the Prior Art

In recent years, the demand of a composite consisting of an organic material and a metal is increasing in the field of an electric material or a structural material. However, since a thermal expansion coefficient of the organic material is much different from that of the metal, there is a possibility of causing a delamination between the organic material and the metal when the composite is used under the condition that it receives a heat cycle or a thermal shock. Therefore, it is desired to improve an adhesion strength between the organic material and the metal.

For example, a multilayer circuit board used for an electronic application consists of a number of internal circuit layers and resin impregnated sheets (prepregs) alternately laminated between external circuit layers or copper foils. Copper conductors are formed on one or both sides of the internal circuit layer by etching. Therefore, for providing an excellent multilayer circuit board, it is necessary for improving an adhesion strength between the copper conductors and the prepreg, or between the copper foil and the prepreg. It is known that the adhesion strength is improved in such a manner that a copper oxide (CuO) layer is formed on the copper conductors or the copper foil by a chemical oxidation method as described in U.S. Pat. No. 4,642,161. That is, it is believed that since a fine irregular surface of the copper oxide layer is obtained by the chemical oxidation, the adhesion strength is increased. However, there is a problem that the copper oxide (CuO) layer formed by the chemical oxidation is readily etched when a multilayer circuit board composed of thus treated internal and external circuit layers is dipped into a chemical plating solution or an electroplating solution including an acid to proceed a through-hole plating. That is, there is a possibility of causing a pink-ring around the through-hole plating. As higher integration of the copper conductors in the multilayer circuit board, a distance between the adjacent through-holes becomes smaller, so that the pink-ring is one of the most important problems to be improved for increasing a confidence of the multilayer circuit board. For overcoming the above problem, it is proposed that after the copper oxide (CuO) layer is formed on the copper conductors, the copper oxide (CuO) layer is reduced to metallic copper having acid insolubility, so that the pink-ring is effectively decreased. However, it is not possible to proceed a perfect reduction of the copper oxide (CuO) layer to metallic copper. Therefore, the reduction method is not always satisfied to perfectly prevent the pink-ring. By the way, in this specification, "oxidation" is defined as a formation of copper oxide in a surface of metallic copper by which a blackening of metallic copper is caused. Therefore, supply of hydroxy groups to the surface of the metallic copper is not included in "oxidation".

SUMMARY OF THE INVENTION

The present invention relates to a method of fabricating an internal composite layer composed of an electrically insulating substrate with a copper layer formed thereon and a film of a coupling agent covering the copper layer for a multilayer circuit board. In the method of the present invention, the copper layer on the insulating substrate is firstly treated with a base to supply hydroxyl groups thereto, so that a surface of the copper layer is filled with the hydroxyl groups. And then, the surface of the copper layer is coated with the coupling agent. The coupling agent is selected from the group consisting of a silane coupling agent, a titinate coupling agent and a zirconate coupling agent. After the copper layer is coated with the coupling agent, the coupling agent is dried to obtain the internal composite layer. The coupling agent is chemically bonded to the surface of the copper layer by the reaction of the hydroxyl groups with the coupling agent.

Therefore, it is a primary object of the present invention to provide a method of fabricating an internal composite layer composed of an electrically insulating substrate with a copper layer formed thereon and a film of a coupling agent covering the copper layer for a multilayer circuit board, which comprises the steps of treating the copper layer with a base to supply hydroxyl groups to a surface of the copper layer, and coating thus treated copper layer with the coupling agent.

It is preferred that sodium hydroxide, potassium hydroxide, or an alcolate such as sodium methylate ($CH_3ONa$), sodium ethylate ($C_2H_5ONa$), and lithium ethylate ($C_2H_5OLi$), etc., is used as the base.

It is also preferred that the copper layer on the insulating substrate is treated with the base in the presence of an accelerating agent to supply the hydroxyl groups and at the same time to generate copper ions by which the hydroxyl groups are stably bonded to the surface of the copper layer. The accelerating agent is selected from the group consisting of a chlorite, a hypochlorite, and a peroxodisulfate.

It is further preferred that an amount of copper oxide resulting from oxidation of the copper layer by the accelerating agent is less than 0.5 g/$m^2$.

In case of producing the multilayer circuit board, at least one internal composite layer and at least one external copper layer are laminated together with resin impregnated sheets (prepregs) interposed therebetween under controlled temperature, pressure, and time. Thus obtained multilayer circuit board is capable of perfectly preventing a pink-ring, while improving an adhesion strength between the prepreg and the copper layer without formation of a copper oxide (CuO) layer in the surface of the copper layer.

By the way, the surface of the copper layer treated with the base and the accelerating agent can be examined by using Munsell color system. That is, it is still further preferred that the surface of the copper layer has hue in a range of 2.5 R to 5 Y, chroma in a range of 2 to 14, and brightness in a range of 3 to 8 in the Munsell color system to obtain an excellent effect of the present invention.

The method for fabricating the internal composite layer of the present invention will be detailed hereinafter.

DETAILED DESCRIPTION OF THE INVENTION

An internal composite layer composed of an electrically insulating substrate with a copper layer formed thereon and a film of a coupling agent covering the copper layer for a multilayer circuit board is made according to a method of the present invention. A glass-epoxy copper clad laminate, or a glass-polyimide copper clad laminate with copper conductors etched on one or both sides can be used as a core of the internal composite layer. It is not concerned that the copper conductors are formed on the insulating substrate by an electroplating, or a chemical plating, etc. It is preferred that at least one surface treatment selected from the group consisting of a surface polishing, e.g., buffing, a chemical polishing, an electrolytic etching, and a liquid honing, etc., is proceeded to the copper conductors. It is not concerned that the surface treatment is proceeded to a copper foil prior to the etching of the copper conductors. After the surface treatment, the copper conductors are treated with a base, or the base and an accelerating agent to supply hydroxyl groups thereto. An ionization of copper, that is,

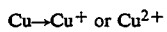

is enhanced by the accelerating agent. On the other hand, the hydroxyl groups are supplied to thus ionized copper atoms from the base, that is,

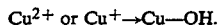

The accelerating agent is selected from a chlorite, e.g., sodium chlorite, a hypochlorite, e.g., sodium hypochlorite and a peroxodisulfate, e.g., potassium peroxodisulfate. It is also preferred that ozone gas is used as the accelerating agent. On the other hand, sodium hydroxide, potassium hydroxide or, an alcolate, e.g., sodium methylate ($CH_3ONa$), sodium ethylate ($C_2H_5ONa$), and lithium ethylate ($C_2H_5OLi$), etc., can be used as the base in the present invention. For supplying the hydroxyl groups to the copper conductors, the clad laminate is dipped into a first solution including the base or the base and the accelerating agent, or the first solution is sprayed upon the copper conductors. It is also possible to supply the hydroxyl groups to the copper conductors by exposing the copper conductors to moisture or vapor. However, when the copper conductors are treated with the base and the accelerating agent in accordance with the above method, there is a possibility of formation of a copper oxide layer, mainly copper oxide (CuO) layer. In the present invention, an amount of copper oxide in surfaces of the copper conductors is less than 0.5 g/m$^2$, and preferably less than 0.2 g/m$^2$. When the amount of copper oxide is more than 0.5 g/m$^2$, there is a problem of causing a pink-ring which usually occurs around a through-hole plating. The amount of copper oxide is determined by a chelatometry method which comprises the step of dipping thus treated copper conductors into an aqueous solution containing 17.4% of hydrochloric acid for 10 minutes at 25° C. In addition, in case of treating the copper conductors with the base and accelerating agent, a color of thus treated copper conductors can be examined by using Munsell color system. That is, it is preferred that the color of the treated copper conductors is hue in a range of 2.5 R to 5 Y, chroma in a range of 2 to 14, and brightness in a range of 3 to 8 in Munsell color system. As the amount of copper oxide is increased, the color becomes to be out of the above range with respect to hue, chroma, and brightness, so that there is a possibility of causing the pink-ring. The color of the treated copper conductors is slightly dark compared with that of the untreated surface thereof. Subsequently, the copper conductors are coated with a coupling agent selected from a silane coupling agent, e.g., γ-aminopropyltriethoxy-silane, γ-glycidoxypropyltrimethoxy-silane, N-β-aminoethyl-γ-aminopropyltrimethoxy-silane, and N-phenyl-γ-aminopropyltrimethoxy-silane, a titanate coupling agent, e.g., tetra-n-butoxytitanium, and a zirconate coupling agent, e.g., zirconium butylate. It is preferred that the silane coupling agent is used for obtaining a high adhesion strength between the copper conductors and the coupling agent. The coupling agent is used by diluting with a solvent such as water, or an alcohol such as ethanol, isopropyl alcohol, butanol, toluene, etc., so that a second solution including the coupling agent is obtained. Though the concentration of the coupling agent is not limited in the present invention, it is preferred to be 0.1 to 30 wt % of the coupling agent. In addition, it is preferred that a small amount of acid, e.g., acetic acid or hydrochloric acid, is added to the second solution to enhance hydrolysis of the coupling agent. For coating the copper conductors with the coupling agent, the clad laminate is dipped into the second solution, or the second solution is sprayed upon the copper conductors. Since the surfaces of the copper conductors are filled with the hydroxyl groups, the coupling agent is chemically bonded to the copper conductors by the reaction of the hydroxyl groups with the coupling agent. For example, in case that the copper conductors are coated with the silane coupling agent, the interface structure therebetween is represented by the formula.

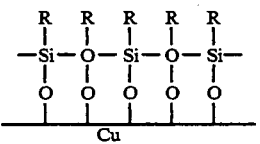

wherein R is an organic functional group such as vinyl group, glycidoxy group, amino group, and mercapto group, etc. Thus coated clad laminate is dried in such a manner as a natural drying, a heat drying, or a vacuum drying, to obtain the internal composite layer. For example, the coated clad laminate is dried under the atmospheric pressure at a temperature of 80° C. to 150° C.

For example, the multilayer circuit board is fabricated in accordance with the following method. That is, at least one of thermosetting resins selected from an epoxy resin, polyimide resin, cyanate-ester resin, and a denatured resin thereof, etc., is impregnated to a fiberglass substrate such as, for example, a glass cloth, glass paper and a glass mat, and then dried to obtain a prepreg. At least one prepreg is located between the internal composite layers, and between the internal composite layer and an external copper layer or a copper foil, and then thus formed piles including the prepregs and the internal composite layers are laminated under a controlled temperature, pressure, and time to obtain the multilayer circuit board. One side of the external copper layer or the copper foil which is bonded with the prepreg is treated with the base, or the base and the accelerating agent and then coated with the coupling agent. As described above, an adhesion strength between the coupling agent and the copper conductors is improved by the reaction of the hydroxyl groups with the coupling agent. As a result, an adhesion strength between the prepreg and the copper conductors is increased in accordance with a chemical cross-linking effect of the coupling agent. By the way, through-holes are punched or drilled in the multilayer circuit board, and then are plated by the chemical plating or the electroplating. Since a copper oxide layer is not formed on the copper conductors in the present invention, the multilayer circuit board shows excellent acid resistance without causing the pink-ring around thus plated through-hole. It is also possible to coat the prepreg with the coupling agent instead of coating the copper conductors with the coupling agent. That is, the prepreg is dipped into the second solution, or the second solution is sprayed upon the prepreg. After thus coated prepreg is dried, it can be used for fabricating the multilayer circuit board. The multilayer circuit board is obtained by laminating thus coated prepregs, and the clad laminates each of which has the copper conductors treated with the base and the accelerating agent, etc. Though the method of fabricating the multilayer circuit board is explained above, it is not concerned that the present invention is applied to fabricate a monolayer circuit board. In addition, it is possible to treat a surface of a copper plate for a copper core multilayer circuit board, or a surface of the copper foil prior to fabrication of the copper clad laminate, with the base, or the base and the accelerating agent in accordance with the method of the present invention.

EXAMPLE 1

[1] An epoxy resin impregnated glass cloth substrate both sides of which have copper foils with the thickness of 35 $\mu$m is prepared. The substrate is 150 mm×0.7 mm. After a chemical polishing is proceeded to the copper foils, copper conductors are formed on the both sides of the substrate by etching.

[2] The substrate with thus formed copper conductors is dipped into a first bath consisting of 1.6 liters of sodium hypochlorite, 40 g of sodium hydroxide, and 1.6 liters of water for 3 minutes at 30° C. to supply hydroxyl groups to the copper conductors. Subsequently, the copper conductors are washed in water, and dried for 30 minutes at 80° C.

[3] The substrate with thus treated copper conductors is dipped, at an immersion velocity of 15 cm/min, into a second bath consisting of 120 g of $\gamma$-aminopropyltriethoxy-silane as a coupling agent and 3000 g of isopropyl alcohol for 1 minute to coat the copper conductors with the coupling agent. The substrate is withdrawn from the second bath at a withdrawal velocity of 15 cm/min. Thus coated copper conductors are left for 24 hours in the atmosphere, and then dried for 3 hours at 120° C. to obtain an internal composite layer.

[4] Three sheets of epoxy resin impregnated glass cloth prepregs are respectively located on the copper conductors of the both sides of the internal composite layer. The thickness of each prepreg is 0.1 mm. In addition, copper foils having the thickness of 18 $\mu$m are located on the prepregs of the both sides of the internal composite layer. Thus formed piles including two copper foils and the internal composite layer are laminated under a pressure of 40 kg/cm$^2$ at a temperature of 170° C. for 120 minutes in a decompression chamber of $6.7 \times 10^{-3}$ Pa, so that a multilayer circuit board including four copper layers is obtained.

EXAMPLE 2

A multilayer circuit board including four copper layers is fabricated in accordance with the same process [1] to [4] as EXAMPLE 1 except that the substrate with the copper conductors is dipped into a first bath consisting of 180 g of sodium chlorite, 30 g of sodium phosphate, and 25 g of sodium hydroxide and 3000 g of water for 1 minute at 30° C.

EXAMPLE 3

A multilayer circuit board including four copper layers is fabricated in accordance with the same process [1] to [4] as EXAMPLE 1 except that the substrate with the copper conductors is dipped into a first bath consisting of 50 g of potassium peroxodisulfate, 100 g of sodium hydroxide and 3000 g of water for 1 minute at 25° C.

EXAMPLE 4

A multilayer circuit board including four copper layers is fabricated in accordance with the same process [1] to [4] as EXAMPLE 1 except that the substrate with the copper conductors is dipped into a second bath consisting of 30 g of N-$\beta$-aminoethyl-$\gamma$-aminopropyl-trimethoxy-silane as the coupling agent and 3000 g of water.

EXAMPLE 5

A multilayer circuit board including four copper layers is fabricated in accordance with the same process [1] to [4] as EXAMPLE 1 except that the substrate with the copper conductors is dipped into a second bath consisting of 20 g of $\gamma$-aminopropyltriethoxy-silane as the coupling agent, 3000 g of water, and 30 g of an aqueous solution containing 0.05N of hydrochloric acid.

EXAMPLE 6

A multilayer circuit board including four copper layers is fabricated in accordance with the same process as EXAMPLE 1 except for the step [2]. The step [2] of EXAMPLE 6 is described below. That is, the substrate with the copper conductors is placed in an ozone generator in which ozone is generated by irradiation of ultraviolet light, and then treated with ozone for 2 minutes. Immediately after the ozone treatment, thus treated substrate is dipped into a first bath consisting of 125 g of sodium methylate, 3000 g of methanol, and 250 g of water for 5 minutes at 30° C. to supply hydroxyl groups to the copper conductors. Subsequently, the copper conductors are washed in water, and dried for 30 minutes at 80° C.

COMPARATIVE EXAMPLE 1

A multilayer circuit board including four copper layers is fabricated in accordance with a process consisting of the steps [1], [3], [4] of EXAMPLE 1 without proceeding the step [2] of EXAMPLE 1.

COMPARATIVE EXAMPLE 2

[1] The epoxy resin impregnated glass cloth substrate both sides of which have the copper foils with the thickness of 35 $\mu$m is prepared. The substrate is 150 mm×150 mm×0.7 mm. After the chemical polishing is proceeded to the copper foils, copper conductors are formed on the both sides of the substrate by etching.

[2] The substrate with thus formed copper conductors is dipped into a first bath consisting of 180 g of sodium hypochlorite, 30 g of sodium phosphate, and 25 g of sodium hydroxide and 3000 g of water for 1 minute at 90° C. to form copper oxide layers in surfaces of the copper conductors. Subsequently, the copper conductors are washed in water, and dried for 60 minutes at 80° C.

[3] In COMPARATIVE EXAMPLE 2, the copper conductors with the copper oxide layers are not coated with the coupling agent.

[4] Three sheets of the epoxy resin impregnated glass cloth prepregs are respectively located on the copper conductors of the both sides of the substrate. The thickness of each prepreg is 0.1 mm. In addition, the copper foils having the thickness of 18 μm are located on the prepregs of the both sides of the substrate. Thus formed piles including two copper foils and the coated copper conductors are laminated together under the pressure of 40 kg/cm² at the temperature of 170° C. for 120 minutes, so that a multilayer circuit board including four copper layers is obtained.

COMPARATIVE EXAMPLE 3

A multilayer circuit board including four copper layers is fabricated in accordance with the following process. That is, after the same steps [1] and [2] as COMPARATIVE EXAMPLE 2, the substrate with the copper oxide layers formed in the surfaces of the copper conductors is dipped, at the immersion velocity of 15 cm/min, into a bath a second bath consisting of 120 g of γ-aminopropyltriethoxy-silane as the coupling agent and 3000 g of isopropyl alcohol for 1 minute to coat the copper conductors with the coupling agent. The substrate is withdrawn from the second bath at the withdrawal velocity of 15 cm/min. Thus withdrawn substrate is left for 24 hours in the atmosphere, and then dried for 3 hours at 120° C. And then, the same [4] as COMPARATIVE EXAMPLE 2 is carried out.

Before the copper conductors are coated with the coupling agent in accordance with the step [3], an amount of copper oxide existing in the surfaces of the treated copper conductors is measured, and also a color of the treated copper conductors is examined by applying Munsell color system with respect to EXAMPLES 1 to 6 and COMPARATIVE EXAMPLES 1 to 3. The results are shown in TABLE 1. In addition, the following tests are performed.

<1> A peel strength of the copper layer

After the multilayer circuit board is dipped into a boiling water for 2 hours, the peel strength between the copper layer having the thickness of 35 μm and the prepreg is measured. The peel strength is also measured without dipping the multilayer circuit board into the boiling water.

<2> A delamination of the multilayer circuit board

Five sheets of the multilayer circuit boards are prepared. After the multilayer circuit boards are dipped into the boiling water for 2 hours, and also dipped into a solder bath at 260° C. for 30 seconds, the number of the multilayer circuit board with the occurrence of the delamination is counted.

<3> Acid resistance of the multilayer circuit board

Through-holes having the diameter of 0.4 mm are drilled in the multilayer circuit board. For examining the acid resistance, the multilayer circuit board with the through-holes is dipped into an aqueous solution containing 17.4% of hydrochloric acid for 10 minutes at 25° C. The copper layers on the substrate are separated from thus treated multilayer circuit board by etching. The occurrence of pink-ring around the through-holes is observed by the microscope at the magnification of ×50.

As shown in TABLE 2, the peel strength of each Example of the present invention is almost equal to that of COMPARATIVE EXAMPLES 2 and 3. The occurrence of the delamination is not observed with respect to all EXAMPLES. On the other hand, COMPARATIVE EXAMPLES 2 and 3 show poor acid resistance because of the occurrence of the pink-ring. However, EXAMPLES 1 to 6 demonstrate excellent acid resistance without causing the pink-ring.

TABLE 1

Results of examinations with respect to an amount of copper oxide and a color of copper conductors treated with a base and an accelerating agent.

| | Amount of copper oxide (g/m²) | hue | brightness | chroma |
|---|---|---|---|---|
| EXAMPLE 1 | 0.08 | 5 YR | 5 | 6 |
| EXAMPLE 2 | 0.11 | 5 YR | 5 | 4 |
| EXAMPLE 3 | 0.15 | 5 YR | 4 | 4 |
| EXAMPLE 4 | 0.07 | 5 YR | 5 | 6 |
| EXAMPLE 5 | 0.08 | 5 YR | 5 | 6 |
| EXAMPLE 6 | 0.00 | 5 YR | 7 | 6 |
| COMPARATIVE EXAMPLE 1 | 0.00 | 5 YR | 7 | 6 |
| COMPARATIVE EXAMPLE 2 | 3.93 | 5 YR | 2 | 2 |
| COMPARATIVE EXAMPLE 3 | 4.01 | 5 YR | 2 | 2 |

TABLE 2

Results of examinations with respent to a delamination and acid resistance of a multilayer circuit board

| | Peal Strength | | | |
|---|---|---|---|---|
| | No Boiling (kg/cm) | Boiling for 2 hrs (kg/cm) | De-lamination (*1) | Acid Resistance (*2) |
| EXAMPLE 1 | 1.32 | 1.18 | 0/5 | ◯ |
| EXAMPLE 2 | 1.25 | 1.12 | 0/5 | ◯ |
| EXAMPLE 3 | 1.29 | 1.13 | 0/5 | ◯ |
| EXAMPLE 4 | 1.15 | 1.07 | 0/5 | ◯ |
| EXAMPLE 5 | 1.21 | 1.14 | 0/5 | ◯ |
| EXAMPLE 6 | 1.18 | 1.10 | 0/5 | ◯ |
| COMPARATIVE EXAMPLE 1 | 0.31 | 0.18 | 4/5 | ◯ |
| COMPARATIVE EXAMPLE 2 | 1.18 | 1.05 | 0/5 | X |
| COMPARATIVE EXAMPLE 3 | 1.33 | 1.16 | 0/5 | X |

*1: For example, 1/5 means that the occurrence of delamination is observed in one of the five sheets of the multilayer circuit board.
*2:
◯: Good
X: Occurrence of pink-ring

EXAMPLE 7

[1] After a buffing is proceeded to two sheets of copper plates, six thousands of through-holes each of which has the diameter of 1.5 mm are drilled in the copper plates, respectively. The through-holes have an arrangement of 100 holes×60 holes. A pitch between the adjacent through-holes is 1.8 mm. Each copper plate is 500 mm×0.5 mm.

[2] The copper plates are dipped into a first bath consisting of 1.6 liters of sodium hypochlorite, 40 g of sodium hydroxide, and 1.6 liters of water for 3 minutes at 30° C. to supply hydroxyl groups to surfaces of the copper plates. Subsequently, the copper plates are washed in water, and dried for 30 minutes at 80° C.

[3] Thus treated copper plates are dipped, at the immersion velocity of 15 cm/min, into a second bath consisting of 120 g of γ-aminopropyltriethoxy-silane as the coupling agent and 3000 g of isopropyl alcohol for 1 minute to coat the copper plates with the coupling agent. The copper plates are withdrawn from the second bath at the withdrawal velocity of 15 cm/min. Thus coated copper plates are left for 24 hours in the atmosphere, and then dried for 3 hours at 80° C.

[4] One of the coated copper plates is located on three sheets of the epoxy resin impregnated glass cloth prepregs. The thickness of each prepreg is 0.1 mm. An epoxy resin including spherical particles of E glass (electrical glass), which is a kind of aluminosilicate glass, in a ratio of 400 PHR is put into the through-holes of the copper plate. And then, another three sheets of the prepregs are located on the copper plate having the epoxy resin. Similarly, the above process is performed to the other coated copper plate located on the prepregs, so that five piles consisting of two copper plates with the epoxy resin and the prepregs are formed.

[5] In addition, copper foils having the thickness of 18 μm are located on both sides of the five piles. Thus formed seven piles including the two copper foils are laminated under 40 kg/cm² at 170° C. for 120 minutes in the decompression chamber of 6.7×10⁻³ Pa, so that a copper core multilayer circuit board is obtained.

EXAMPLE 8

A copper core multilayer circuit board is fabricated in accordance with the same process as EXAMPLE 7 except that an additional step [3'] is proceeded between the steps [2] and [3]. The step [3'] of EXAMPLE 8 is described below. That is, the treated copper core plates are dipped, at the immersion velocity of 10 cm/min, into a bath consisting of 30 g of tetra-n-butoxytitanium as the coupling agent and 3000 g of n-butanol for 1 minute to coat the copper plates with the coupling agent. The copper plates are withdrawn from the bath at the withdrawal velocity of 10 cm/min. Thus coated copper plates are left for 24 hours in the atmosphere, and then dried for 3 hours at 100° C.

EXAMPLE 9

A copper core multilayer circuit board is fabricated in accordance with the same process as EXAMPLE 7 except for the step [3]. The step [3] of EXAMPLE 9 is described below. That is, the treated copper plates are dipped, at the immersion velocity of 15 cm/min, into a second bath consisting of 90 g of γ-aminopropyltriethoxy-silane as the coupling agent, 30 g of tetra-n-butoxytitanium, and 3000 g of n-butanol for 1 minute to coat the copper plates with the coupling agent. The copper plates are withdrawn from the second bath at the withdrawal velocity of 15 cm/min. Thus coated copper plates are left for 24 hours in the atmosphere, and then dried for 3 hours at 100° C.

EXAMPLE 10

A copper core multilayer circuit board is fabricated in accordance with the same process as EXAMPLE 7 except for the step [3]. The step [3] of EXAMPLE 10 is described below. That is, the treated copper plates are dipped, at the immersion velocity of 15 cm/min, into a second bath consisting of 50 g of γ-aminopropyltriethoxy-silane as the coupling agent, 10 g of zirconium butylate, and 3000 g of toluene for 1 minute to coat the copper plates with the coupling agent. The copper plates are withdrawn from the second bath at the withdrawal velocity of 15 cm/min. Thus coated copper plate are left for 24 hours in the atmosphere, and then dried for 1 hours at 120° C.

Before the copper plates are coated with the coupling agent in accordance with the step [3] or [3'], an amount of copper oxide existing in the surfaces of the treated copper plates is measured, and also a color of the treated copper plates is examined by applying Munsell color system with respect to EXAMPLES 7 to 10. In addition, the following tests are performed.

<1> A delamination of the copper core multilayer circuit board

With respect to each of EXAMPLES 7 to 10, ten sheets of the copper core multilayer circuit boards each of which is 50 mm×50 mm are prepared. After the multilayer circuit boards are dipped into the boiling water for 2 hours, and also dipped into the solder bath at 260° C. for 1 minute, the number of the multilayer circuit board with the occurrence of the delamination is counted.

<2> Acid resistance of the copper core multilayer circuit board

Through-holes having the diameter of 0.9 mm are drilled in the multilayer circuit board. For examining the acid resistance, the multilayer circuit board is dipped into the aqueous solution containing 17.4% of hydrochloric acid for 10 minutes at 25° C. The occurrence of the pink-ring around the through-holes is observed by the microscope at the magnification of ×50.

As shown in TABLE 3, the occurrence of the delamination is not observed at all with respect to EXAMPLES 7, 8 and 10. On the other hand, EXAMPLES 7 to 10 demonstrate excellent acid resistance without causing the pink-ring.

TABLE 3

| | Results of examinations performed with respect to EXAMPLES 7 to 10 | | | | | |
|---|---|---|---|---|---|---|
| | The number of Delamination (*1) | Acid Resistance (*2) | Amount of copper oxide (g/cm²) | Hue | Chroma | Brightness |
| EXAMPLE 7 | 0/10 | ◯ | 0.08 | 5 YR | 5 | 6 |
| EXAMPLE 8 | 0/10 | ◯ | 0.09 | 5 YR | 5 | 6 |
| EXAMPLE 9 | 1/10 | ◯ | 0 | 5 YR | 7 | 6 |

TABLE 3-continued

Results of examinations performed with respect to EXAMPLES 7 to 10

| | The number of Delamination (*1) | Acid Resistance (*2) | Amount of copper oxide (g/cm$^2$) | Hue | Chroma | Brightness |
|---|---|---|---|---|---|---|
| EXAMPLE 10 | 0/10 | ◯ | 0 | 5 YR | 7 | 6 |

(*1) For example, 1/10 means that the occurrence of the delamination is observed in one of ten sheets of copper core multilayer circuit board.
(*2)
◯: Good
X:Occurrence of pink-ring

EXAMPLE 11

[1] The epoxy resin impregnated glass cloth substrate both sides of which have the copper foils with the thickness of 35 μm is prepared. The substrate is 150 mm×150 mm×0.7 mm. After the buffing is proceeded to the copper foils, copper conductors are formed on the both sides of the substrate by etching.

[2] The substrate with thus formed copper conductors is dipped into a first bath consisting of 1 liter of methanol (CH$_3$OH), 35 g of sodium methylate (CH$_3$ONa), 65 cc of water for 3 minutes at 30° C. to supply hydroxyl groups to copper conductors. Subsequently, the copper conductors are washed in water, and dried for 60 minutes at 80° C.

[3] The substrate with thus treated copper conductors is dipped, at the immersion velocity of 30 cm/min, into a second bath consisting of 40 cc of γ-aminopropyltriethoxy-silane as the coupling agent and a 1 liter of isopropyl alcohol for 1 minute to coat the copper conductors with the coupling agent. The substrate is withdrawn from the second bath at the withdrawal velocity of 30 cm/min. Thus coated copper conductors are left for 1 hour in the atmosphere, and then dried for 3 hours at 80° C. to obtain an internal composite layer.

[4] Three sheets of the epoxy resin impregnated glass cloth prepregs are respectively located on the copper conductors of the both sides of the internal composite layer. The thickness of each prepreg is 0.1 mm. In addition, the copper foils having the thickness of 18 μm are located on the prepregs of the both sides of the internal composite layer. Thus formed piles including two copper foils and the internal composite layer are laminated together under 40 kg/cm$^2$ at a170° C. for 120 minutes so that a multilayer circuit board including four copper layers is obtained.

EXAMPLE 12

A multilayer circuit board including four copper layers is fabricated in accordance with the same process [1] to [4] as EXAMPLE 11 except that the substrate with the treated copper conductors is dipped into a second bath consisting of 40 cc of N-β-aminoethyl-γ-aminopropyltrimethoxy-silane as the coupling agent, and 1 liter of isopropyl alcohol.

EXAMPLE 13

A multilayer circuit board including four copper layers is fabricated in accordance with the same process [1] to [4] as EXAMPLE 11 except that the substrate with the treated copper conductors is dipped into a second bath consisting of 40 cc of γ-aminopropyltriethoxy-silane as the coupling agent, 1 liter of isopropyl alcohol, and 9.6 cc of the aqueous solution containing 0.05N of hydrochloric acid.

EXAMPLE 14

A multilayer circuit board including four copper layers is fabricated in accordance with the same process [1] to [4] as EXAMPLE 11 except that the substrate with the treated copper conductors is dipped into a second bath consisting of 10 cc of γ-aminopropyltriethoxy-silane as the coupling agent, 1 liter of isopropyl alcohol, and 9.6 cc of the aqueous solution containing 0.05 N of hydrochloric acid.

EXAMPLE 15

A multilayer circuit board including four copper layers is fabricated in accordance with the same process as EXAMPLE 11 except for the step [2]. The step [2]of EXAMPLE 15 is described below. That is, the substrate with the copper conductors is dipped into a first bath consisting of 40 g of sodium hydroxide, and 1 liter of water for 3 minutes at 30° C. to supply hydroxyl groups to the copper conductors. Subsequently, the copper conductors are washed in water, and dried for 60 minutes at 80° C.

COMPARATIVE EXAMPLE 4

A multilayer circuit board including four copper layers is fabricated in accordance with a process consisting of the steps [1] and [4] of EXAMPLE 11 without proceeding the steps [2] and [3] of EXAMPLE 11.

COMPARATIVE EXAMPLE 5

A multilayer circuit board including four copper layers is fabricated in accordance with the same process as EXAMPLE 11 except for the step [2]. The step [2] of COMPARATIVE EXAMPLE 5 is described below. That is, the substrate with the copper conductors is dipped into a first bath consisting of 45.6 g of CuCl$_2$.2-H$_2$O, 800 cc of water, and 350 cc of an aqueous solution containing 35% of hydrochloric acid for 1 minute at 30° C. for soft etching of the copper conductors. Subsequently, the copper conductors are washed in water, and dried for 60 minutes at 80° C.

COMPARATIVE EXAMPLE 6

[1] The epoxy resin impregnated glass cloth substrate both sides of which have the copper foils with the thickness of 35 μm is prepared. The substrate is 150 mm×150 mm×0.7 mm. After the buffing is proceeded to the copper foils, the copper conductors are formed on the both sides of the substrate by etching.

[2] The substrate with thus formed copper conductors is dipped into a first bath consisting of 60 g of NaClO$_2$, 10 g of Na$_3$PO$_4$.12H$_2$O, 8 g of sodium hydroxide, and 1 liter of water for 1 minute at 30° C. to form copper oxide (CuO) layers on the copper conductors.

[3] In COMPARATIVE EXAMPLE 6, the copper conductors with the copper oxide (CuO) layers are not coated with the coupling agent.

[4] Three sheets of the epoxy resin impregnated glass cloth prepregs are respectively located on the copper conductors of the both sides of the substrate. The thickness of each prepreg is 0.1 mm. In addition, the copper foils having the thickness of 18 $\mu$m are located on the prepregs of the both sides of the substrate. Thus formed piles including two copper foils and the copper conductors with the copper oxide (CuO) layers are laminated together under 40 kg/cm$^2$ at 170° C. for 120 minutes, so that a multilayer circuit board including four copper layers is obtained.

The following tests are performed with respect to EXAMPLES 11 to 15 and COMPARATIVE EXAMPLES 4 to 6.

<1> A peel strength of the copper layer

After the multilayer circuit board is dipped into a boiling water for 2 hours, the peel strength between the copper layer having the thickness of 35 $\mu$m and the prepreg is measured. The peel strength is also measured without dipping the multilayer circuit board into the boiling water.

<2> A delamination of the multilayer circuit board

Five sheets of the multilayer circuit boards each of which is 50 mm×50 mm are prepared. After the multilayer circuit boards are dipped into the boiling water for 2 hours, and also dipped into the solder bath at 260° C. for 30 seconds, the number of the multilayer circuit board with the occurrence of the delamination is counted.

<3> Acid resistance of the multilayer circuit board

Through-holes having the diameter of 0.4 mm are drilled in the multilayer circuit board. For examining the acid resistance, the multilayer circuit board is dipped into the aqueous solution containing 17.4% of hydrochloric acid for 10 minutes at 25° C. The copper layers on the substrate are separated from thus treated multilayer circuit board by etching. The occurrence of the pink-ring around the throughholes is observed by the microscope at the magnification of X 50.

As shown in TABLE 4, the peel strength of each Example is almost equal to that of COMPARATIVE EXAMPLE 6. The occurrence of the delamination is not observed at all with respect to EXAMPLES 11 to 15. On the other hand, COMPARATIVE EXAMPLES 6 show poor acid resistance because of the occurrence of the pink-ring. However, EXAMPLES 11 to 15 demonstrate excellent acid resistance without causing the pink-ring.

TABLE 4

Results of examinations with respect to a delamination and acid resistance of a multilayer circuit board

| | Peel strength | | | |
|---|---|---|---|---|
| | No Boiling (kg/cm) | Boiling (kg/cm) | Delamination (*1) | Acid Resistance (*2) |
| EXAMPLE 11 | 1.17 | 1.10 | 0/5 | ○ |
| EXAMPLE 12 | 1.15 | 1.06 | 0/5 | ○ |
| EXAMPLE 13 | 1.22 | 1.12 | 0/5 | ○ |
| EXAMPLE 14 | 1.12 | 1.07 | 0/5 | ○ |
| EXAMPLE 15 | 1.06 | 0.98 | 0/5 | ○ |
| COMPARATIVE EXAMPLE 4 | 0.02 | 0.02 | 5/5 | ○ |
| COMPARATIVE EXAMPLE 5 | 0.95 | 0.78 | 2/5 | ○ |
| COMPARATIVE EXAMPLE 6 | 1.18 | 1.09 | 0/5 | X |

*1 For example, 1/5 means that the occurrence of the delamination is observed in one of five sheets of the multilayer circuit board.
*2:
○: Good
X: Occurrence of pink-ring

What is claimed is:

1. A method of fabricating an internal composite layer for a multilayer circuit board, said internal composite layer composed of an electrically insulating substrate with a copper layer formed thereon and a film of a coupling agent covering said copper layer, said method comprising the steps of:
   treating said copper layer on said substrate with a base to supply hydroxyl groups thereto in the form of Cu—OH and make the surface of said copper layer replete with said hydroxyl groups;
   coating a coupling agent on said surface of the copper layer, said coupling agent being selected from the group consisting of a silane coupling agent, a titanate coupling agent and a zirconate coupling agent; and
   drying said coupling agent to form said film on said copper layer, thereby preparing said internal composite layer in which the coupling agent is chemically bonded to the surface of said copper layer by the reaction of the hydroxyl groups with the coupling agent.

2. A method according to claim 1, wherein said base is selected from the group consisting of sodium hydroxide potassium hydroxide, and sodium methylate, sodium ethylate and lithium ethylate.

3. A method according to claim 1, wherein the silane coupling agent is selected from the group consisting of γ-aminopropyltriethoxy-silane, γ-glycidoxypropyl-trimethoxy-silane, N-β-aminoethyl-γ-aminopropyl-trimethoxy-silane, and N-phenyl-γ-aminopropyl-trimetoxy-silane.

4. A method according to claim 1, wherein the titanate coupling agent is tetra-n-butoxytitanium.

5. A method according to claim 1, wherein the zirconate coupling agent is zirconium butylate.

6. A method according to claim 1, wherein said copper layer is in the form of a conductor pattern.

7. A method according to claim 1, wherein said hydro groups are supplied to said copper layer on said substract a temperature of less than 50° C.

8. A method of fabricating an internal composite layer for a multilayer circuit board, said internal composite layer composed of an electrically insulating substrate with a copper layer formed thereon and a film of a coupling agent covering said copper layer, said method comprising the steps of:
   treating said copper layer on said substrate with a base in the presence of an accelerating agent to supply hydroxyl groups and at the same time to generate copper ions by which said hydroxyl groups are stably bonded to the surface of said copper layer in the form of Cu-OH, thereby making the surface of said copper layer replete with the hydroxyl groups;

coating a coupling agent on said surface of the copper layer, said coupling agent being selected from the group consisting of a silane coupling agent, a titanate coupling agent and a zirconate coupling agent; and drying said coupling agent to form said film on said copper layer, thereby preparing said internal composite layer in which the coupling agent is chemically bonded to the surface of said copper layer by the reaction of the hydroxyl groups with the coupling agent.

9. A method according to claim 8, wherein said accelerating agent is selected from the group consisting of a chlorite, a hypochlorite, a peroxodisulfate and ozone.

10. A method according to claim 8, wherein an amount of copper oxide resulting from oxidation of copper in the surface of said copper layer by said accelerating agent is less than 0.5 g/m$^2$.

11. A method according to claim 8, wherein the surface of said copper layer treated by the base and said accelerating agent has hue in a range of 2.5R to 5Y, chroma in a range of 2 to 14, and brightness in a range of 3 to 8 in Munsell color system.

12. A method according to claim 8, wherein said copper layer is in the form of a conductor pattern.

13. A method according to claim 8, wherein said hydroxyl groups are supplied to said copper layer on said substrate at a temperature of less than 50° C.

14. A method of fabricating a multilayer circuit board including at least one internal composed layer composed of an electrically insulating substrate with a copper layer formed thereon and a film of a coupling agent, said method comprises the steps of:

treating said copper layer on said substrate with a base in the presence of an accelerating agent to supply hydroxyl groups and at the same time to generate copper ions by which said hydroxyl groups are stably bonded to the surface of said copper layer in the form of Cu—OH, thereby making the surface of said copper layer replete with the hydroxy groups;

coating a coupling agent on said surface of the copper layer, said coupling agent being selected from the group consisting of a silane coupling agent, a titanate coupling agent and a zirconate coupling agent;

drying said coupling agent to form said film on said copper layer to thereby prepare said internal composite layer in which the coupling agent is chemically bonded to the surface of said copper layer by the reaction of the hydroxyl groups with the coupling agent; and laminating at least one said internal composite layer and at least one external copper layer with prepregs interposed therebetween under controlled temperature, pressure, and time to obtain said multilayer circuit board.

* * * * *